United States Patent
Park

(10) Patent No.: US 8,513,697 B2
(45) Date of Patent: Aug. 20, 2013

(54) LIGHT EMITTING DEVICE, METHOD OF MANUFACTURING THE SAME, LIGHT EMITTING DEVICE PACKAGE, AND ILLUMINATION SYSTEM

(75) Inventor: Kyung Wook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 320 days.

(21) Appl. No.: 12/884,843

(22) Filed: Sep. 17, 2010

(65) Prior Publication Data

US 2011/0090689 A1     Apr. 21, 2011

(30) Foreign Application Priority Data

Oct. 21, 2009    (KR) .................. 10-2009-0100071

(51) Int. Cl.
*H01L 29/66*    (2006.01)

(52) U.S. Cl.
USPC .................. 257/99; 257/79; 438/22; 362/235

(58) Field of Classification Search
USPC .............................. 257/99; 438/22; 362/235
See application file for complete search history.

(56) References Cited

U.S. PATENT DOCUMENTS

| | | | |
|---|---|---|---|
| 2005/0139825 A1* | 6/2005 | Song et al. | 257/44 |
| 2006/0081869 A1* | 4/2006 | Lu et al. | 257/99 |
| 2006/0157724 A1* | 7/2006 | Fujita | 257/99 |
| 2006/0158895 A1* | 7/2006 | Brands et al. | 362/555 |
| 2009/0078951 A1* | 3/2009 | Miki et al. | 257/98 |
| 2010/0032701 A1* | 2/2010 | Fudeta | 257/98 |
| 2011/0024788 A1* | 2/2011 | Ogihara et al. | 257/99 |
| 2011/0220955 A1* | 9/2011 | Park | 257/99 |
| 2012/0267673 A1* | 10/2012 | Okabe et al. | 257/99 |

FOREIGN PATENT DOCUMENTS

KR    10-2009-002191 A    1/2009

* cited by examiner

*Primary Examiner* — Julio J Maldonado
*Assistant Examiner* — Robert Bachner
(74) *Attorney, Agent, or Firm* — McKenna Long & Aldridge, LLP

(57) ABSTRACT

A light emitting device includes a light emitting structure including a first conductive semiconductor layer, a second conductive semiconductor layer, and an active layer between the first and second conductive semiconductor layers; a first electrode on the first conductive semiconductor layer; a transparent electrode layer on the second conductive semiconductor layer; and a second electrode on the transparent electrode layer, where the second electrode is anchored to the transparent electrode.

20 Claims, 7 Drawing Sheets

US 8,513,697 B2

LIGHT EMITTING DEVICE, METHOD OF MANUFACTURING THE SAME, LIGHT EMITTING DEVICE PACKAGE, AND ILLUMINATION SYSTEM

The present application claims priority under 35 U.S.C. §119(a) of Korean Patent Application No. 10-2009-0100071 filed on Oct. 21, 2009, which is hereby incorporated by reference in its entirety.

BACKGROUND

The embodiment relates to a light emitting device, a method of manufacturing the same, a light emitting device package, and an illumination system.

Recently, various studies and researches have been carried out regarding a device employing a light emitting diode (LED) as a light emitting device.

The LED converts electrical energy into light by using the characteristic of a compound semiconductor. The LED has a stack structure of a first conductive semiconductor layer, an active layer, and a second conductive semiconductor layer, and emits light through the active layer as power is applied thereto.

A first electrode layer is formed on the first conductive semiconductor layer and a second electrode layer is formed on the second conductive semiconductor layer.

Meanwhile, a transparent electrode layer, such as an ITO layer, is formed on the second conductive semiconductor layer to achieve current spreading effect and the second electrode layer is formed on the transparent electrode layer.

However, since adhesive force between the transparent electrode layer and the second electrode layer is weak, the second electrode layer may be separated from the transparent electrode layer.

SUMMARY

The embodiment provides a light emitting device having a novel structure, a method of manufacturing the same, a light emitting device package, and an illumination system.

The embodiment provides a light emitting device having a transparent electrode layer securely coupled with a second electrode layer, a method of manufacturing the same, a light emitting device package, and an illumination system.

A light emitting device according to the embodiment includes a light emitting structure including a first conductive semiconductor layer, a second conductive semiconductor layer, and an active layer between the first and second conductive semiconductor layers; a first electrode on the first conductive semiconductor layer; a transparent electrode layer on the second conductive semiconductor layer; and a second electrode on the transparent electrode layer, wherein the second electrode is anchored to the transparent electrode.

A light emitting device package according to the embodiment includes a body; first and second package electrodes on the body; a light emitting device electrically connected to the first and second package electrodes on the body; and a molding member surrounding the light emitting device on the body, wherein the light emitting device includes a light emitting structure including a first conductive semiconductor layer, a second conductive semiconductor layer, and an active layer between the first and second conductive semiconductor layers; a first electrode on the first conductive semiconductor layer; a transparent electrode layer on the second conductive semiconductor layer; and a second electrode on the transparent electrode layer, wherein the second electrode is anchored to the transparent electrode.

An illumination system according to the embodiment includes a light emitting module including a substrate and at least one light emitting device installed on the substrate as a light source, wherein the light emitting device includes a light emitting structure including a first conductive semiconductor layer, a second conductive semiconductor layer, and an active layer between the first and second conductive semiconductor layers; a first electrode on the first conductive semiconductor layer; a transparent electrode layer on the second conductive semiconductor layer; and a second electrode on the transparent electrode layer, wherein the second electrode is anchored to the transparent electrode.

A method of manufacturing a light emitting device according to the embodiment includes the steps of forming a light emitting structure including a first conductive semiconductor layer, an active layer and a second conductive semiconductor layer; forming a transparent electrode layer on the second conductive semiconductor layer; and forming an electrode that is anchored to the transparent electrode layer.

DETAILED DESCRIPTION OF THE EMBODIMENTS

Figure 1:
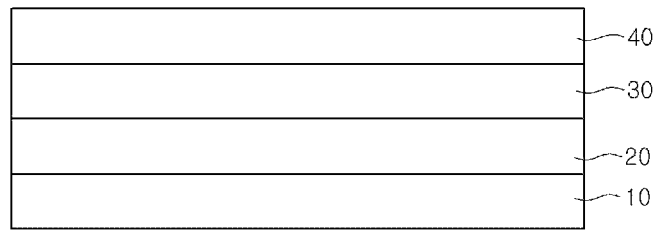
FIGS. 1 to 5 are sectional views showing a procedure for manufacturing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present.

The thickness and size of each layer shown in the drawings may be exaggerated, omitted or schematically drawn for the purpose of convenience or clarity. In addition, the size of elements does not utterly reflect an actual size.

Hereinafter, a light emitting device, a method of manufacturing the same, a light emitting device package, and an illumination system according to the embodiments will be described in detail with reference to accompanying drawings.

FIGS. 1 to 5 are sectional views showing a procedure for manufacturing a light emitting device according to a first embodiment.

Figure 5:
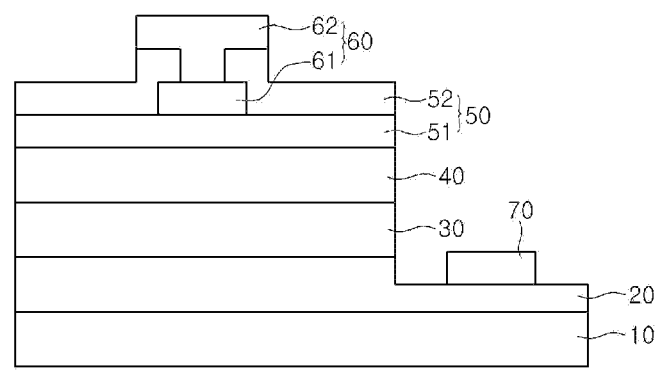
Figure 6:
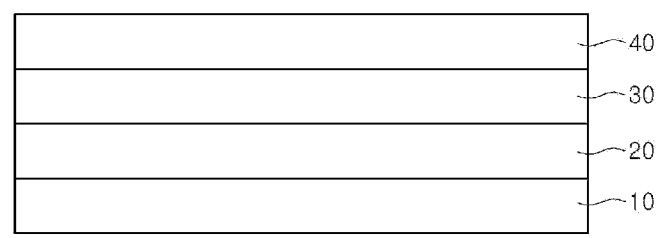
FIGS. 6 to 11 are sectional views showing a procedure for manufacturing a light emitting device according to a second embodiment.

Referring to FIG. 5, the light emitting device according to the first embodiment includes a light emitting structure having a first conductive semiconductor layer 20, an active layer 30 and a second conductive semiconductor layer 40, which are sequentially formed on a growth substrate 10. A first electrode 70 is formed on the first conductive semiconductor layer 20 and a transparent electrode layer 50 and a second electrode 60 are formed on the second conductive semiconductor layer 40.

The first growth substrate 10 may include at least one of $Al_2O_3$, Si, SiC, GaAs, ZnO, MgO, GaN, $Ga_2O_3$, or glass.

The light emitting structure may include a GaN-based semiconductor layer. The light emitting structure can be formed by using GaN, InGaN, AlGaN, or InAlGaN.

For instance, the first conductive semiconductor layer 20 includes an n type semiconductor layer. The first conductive semiconductor layer 20 may include semiconductor material having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the first conductive semiconductor layer 20 may be doped with n type dopant such as Si, Ge or Sn.

Electrons (or holes) injected through the first conductive semiconductor layer 20 couples holes (or electrons) injected through the second conductive semiconductor layer 40 at the active layer 30, so that the active layer 30 emits light based on a band gap difference of an energy band according to material of the active layer 30.

The active layer 30 may have a single quantum well structure, a multiple quantum well (MQW) structure, a quantum wire structure or a quantum dot structure, but the embodiment is not limited thereto.

The active layer 30 may include semiconductor material having the compositional formula of $In_xAl_yGa_{1-x-y}N$ ($0 \leq x \leq 1$, $0 \leq y \leq 1$, $0 \leq x+y \leq 1$). If the active layer 30 has the MQW structure, the active layer 30 has a stack structure including a plurality of well layers and a plurality of barrier layers. For instance, the active layer 30 may have a stack structure of an InGaN well layer/a GaN barrier layer.

A clad layer (not shown) doped with the n type or p type dopant can be formed on and/or under the active layer 30. The clad layer may include an AlGaN layer or an InAlGaN layer.

The second conductive semiconductor layer 40, for example, includes a p type semiconductor layer. The second conductive semiconductor layer 40 may include semiconductor material having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the second conductive semiconductor layer 40 may be doped with p type dopant such as Mg, Zn, Ca, Sr, or Ba.

In contrast, the first conductive semiconductor layer 20 may include a p type semiconductor layer and the second conductive semiconductor layer 40 may include an n type semiconductor layer. In addition, a third conductive semiconductor layer (not shown) including an n type or a p type semiconductor layer can be formed on the second conductive semiconductor layer 40. Thus, the light emitting structure may have one of NP, PN, NPN or PNP junction structures. In addition, the conductive dopant can be uniformly or non-uniformly doped in the first and second conductive semiconductor layers 20 and 40. That is, the light emitting structure may have various structures and the embodiment is not limited thereto.

In other words, the light emitting structure including the first conductive semiconductor layer 20, the active layer 30 and the second conductive semiconductor layer 40 can be variously modified without limitation.

The transparent electrode layer 50 includes a first transparent electrode layer 51 formed on the second conductive semiconductor layer 40 and a second transparent electrode layer 52 formed on the first transparent electrode layer 51. In addition, the second electrode 60 includes a constraining layer 61 formed on the first transparent electrode layer 51 and a support layer 62 formed on the constraining layer 61. In addition, the first electrode 70 is formed on the first conductive semiconductor layer 20. According to the first embodiment, the first electrode 70 is formed on the first conductive semiconductor layer 20 and the second electrode 60 is formed on the second conductive semiconductor layer 40.

According to the light emitting device of the first embodiment, the second electrode 60 is anchored to the transparent electrode. The term, "anchored," includes but not limited to any mechanical combination between the second electrode and the transparent electrode thereby reinforcing the coupling force therebetween. For example, a part of the constraining layer 61 is disposed between the first and second transparent electrode layers 51 and 52, and a part of the second transparent electrode layer 52 is disposed between the constraining layer 61 and the support layer 62.

A bottom surface of the constraining layer 61 makes contact with a top surface of the first transparent electrode layer 51, and a lateral side and a top surface of the constraining layer 61 make contact with the second transparent electrode layer 52. The constraining layer 61 partially makes contact with the support layer 62 such that the constraining layer 61 can be electrically connected to the support layer 62.

That is, the constraining layer 61 is constrained by the first and second transparent electrode layers 51 and 52, so the transparent electrode layer 50 can be securely coupled with the second electrode 60.

Strong adhesive force is applied between the first and second transparent electrode layers 51 and 52 and between the constraining layer 61 and the support layer 62. In a conventional structure, a transparent electrode layer may be separated from the second electrode due to weak adhesive force therebetween. Thus, according to the light emitting device of the first embodiment, the second electrode 60 is partially surrounded by the transparent electrode layer 50.

As a result, the transparent electrode layer 50 can be securely coupled with the second electrode 60.

Hereinafter, a method of manufacturing the light emitting device according to the first embodiment will be described with reference to FIGS. 1 to 5. First, the growth substrate 10 is prepared and the light emitting structure including the first conductive semiconductor layer 20, the active layer 30 and the second conductive semiconductor layer 40 is formed on the growth substrate 10. In addition, a buffer layer (not shown) and an undoped GaN layer (not shown) can be formed between the growth substrate 10 and the first conductive semiconductor layer 20.

The growth substrate 10 may include one of sapphire, SiC, Si, GaAs, ZnO, MgO, GaN, Glass or $Ga_2O_3$. The buffer layer may include stack structure, such as $In_xGa_{1-x}N/GaN$ or $Al_xIn_yGa_{1-(x+y)}N/In_xGa_{1-x}N/GaN$. For instance, the buffer layer can be grown by injecting trimethyl gallium (TMGa) gas, trimethyl indium (TMIn) gas and trimethyl aluminum (TMAl) gas into the chamber together with hydrogen gas and ammonia gas.

The first conductive semiconductor layer 20 can be grown by injecting TMGa gas and $SiH_4$ gas including n type impurities (for example, Si) into the chamber together with hydrogen gas and ammonia gas. In addition, the active layer 30 and the second conductive semiconductor layer 40 are formed on the first conductive semiconductor layer 20.

The active layer 30 may have a single quantum well structure or a multiple quantum well (MQW) structure. For instance, the active layer 30 may have a stack structure including an InGaN well layer and a GaN barrier layer.

The second conductive semiconductor layer 40 can be grown by injecting TMGa gas and (EtCp$_2$Mg){Mg(C$_2$H$_5$C$_5$H$_4$)$_2$} gas including p type impurities (for example, Mg) into the chamber together with hydrogen gas and ammonia gas.

Figure 2:
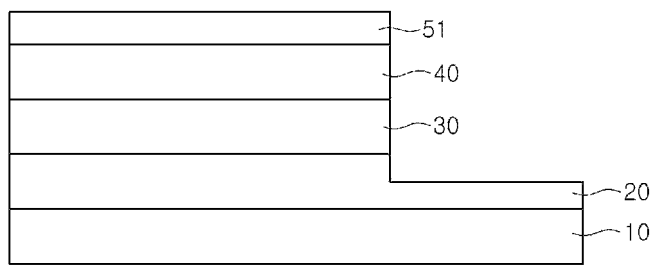

Referring to FIG. 2, a mesa etching process is performed to partially remove the second conductive semiconductor layer 40, the active layer 30 and the first conductive semiconductor layer 20. A part of the first conductive semiconductor layer 20 is exposed upward after the mesa etching process.

Then, the first transparent electrode layer 51 is formed on the second conductive semiconductor layer 40. The first transparent electrode layer 51 can be formed over the whole area of the second conductive semiconductor layer 40.

The first transparent electrode layer 51 may include one of ITO, ZnO, GZO, RuO$_x$, or IrO$_x$, wherein x is an integer.

Figure 3:
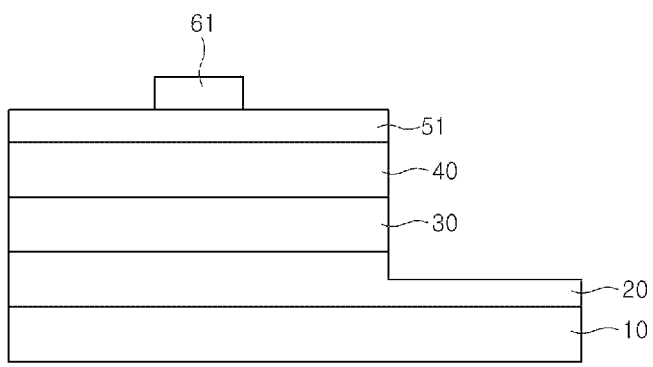

Referring to FIG. 3, the constraining layer 61 is formed on the first transparent electrode layer 51. The constraining layer 61 can be prepared in the form of a multiple metal layer including an adhesive metal layer or a reflective metal layer. For instance, the constraining layer 61 may include at least one of Cr, Ti or Ni, or at least one of Ag or Al. The constraining layer 61 may have various shapes, such as a circle, a triangle, a hexagon or a cross, when viewed from the top thereof.

Figure 4:
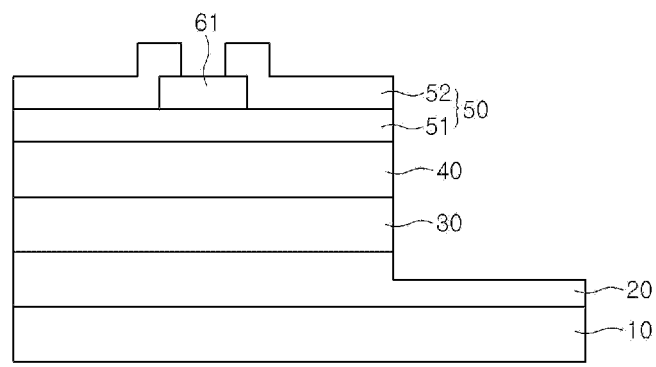

Referring to FIG. 4, the second transparent electrode layer 52 is formed on the first transparent electrode layer 51 and the constraining layer 61 such that the lateral side and the top surface of the constraining layer 61 can be partially covered with the second transparent electrode layer 52. The second transparent electrode layer 52 may include at least one of ITO, ZnO, GZO, RuO$_x$, or IrO$_x$, wherein x is an integer. The second transparent electrode layer 52 can be formed by using material identical to material for the first transparent electrode layer 51.

Thus, the second transparent electrode layer 52 can be securely bonded with the first transparent electrode layer 51.

As the second transparent electrode layer 52 is formed, the top surface of the constraining layer 61 is partially exposed.

Referring to FIG. 5, the support layer 62 is formed on the constraining layer 61 and the second transparent electrode layer 52. The support layer 62 can be securely bonded with the constraining layer 61.

The support layer 62 can be formed by using the material identical to or different from the material for the constraining layer 61. For instance, the support layer 62 may further include a metal layer, such as an Au layer in addition to the material for the constraining layer 61. The first electrode 70 is formed on the first conductive semiconductor layer 20.

As a result, the light emitting device according to the first embodiment is manufactured. According to the light emitting device of the first embodiment, the bottom surface, the lateral side and the top surface of the second electrode 60 are partially constrained by the transparent electrode layer 50, so that the coupling force between the second electrode 60 and the transparent electrode layer 50 can be enhanced, so that the electric reliability can be improved.

FIGS. 6 to 11 are sectional views showing a procedure for manufacturing a light emitting device according to a second embodiment.

Figure 11:
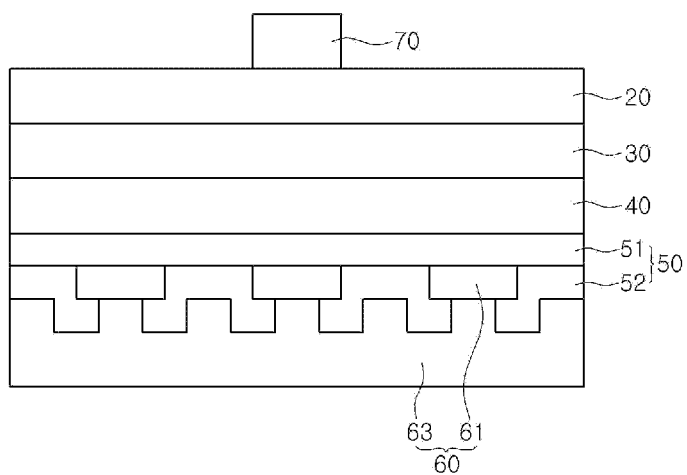

First, the light emitting device according to the second embodiment will be described with reference to FIG. 11. The light emitting device according to the second embodiment includes a light emitting structure having a first conductive semiconductor layer 20, an active layer 30, and a second conductive semiconductor layer 40. A first electrode 70 is formed on the first conductive semiconductor layer 20 and a transparent electrode layer 50 and a second electrode 60 are formed on the second conductive semiconductor layer 40.

The light emitting structure may include a GaN-based semiconductor layer. For instance, the light emitting structure may include GaN, InGaN, AlGaN, or InAlGaN.

For instance, the first conductive semiconductor layer 20 includes an n type semiconductor layer. The first conductive semiconductor layer 20 may include semiconductor material having the compositional formula of In$_x$Al$_y$Ga$_{1-x-y}$N (0≦x≦1, 0≦y≦1, 0≦x+y≦1), such as InAlGaN, GaN, AlGaN, InGaN, AlInN, AlN, or InN. In addition, the first conductive semiconductor layer 20 may be doped with n type dopant such as Si, Ge or Sn.

Electrons (or holes) injected through the first conductive semiconductor layer 20 couples holes (or electrons) injected through the second conductive semiconductor layer 40 at the active layer 30, so that the active layer 30 emits light based on a band gap difference of an energy band according to material of the active layer 30.

The active layer 30 may have a single quantum well structure, a multiple quantum well (MQW) structure, a quantum wire structure or a quantum dot structure, but the embodiment is not limited thereto.

The active layer 30 may include semiconductor material having the compositional formula of In$_x$Al$_y$Ga$_{1-x-y}$N (0≦x≦1, 0≦y≦1, 0≦x+y≦1). If the active layer 30 has the MQW structure, the active layer 30 has a stack structure including a plurality of well layers and a plurality of barrier layers. For instance, the active layer 30 may have a stack structure of an InGaN well layer/a GaN barrier layer.

A clad layer (not shown) doped with the n type or p type dopant can be formed on and/or under the active layer 30. The clad layer may include an AlGaN layer or an InAlGaN layer.

The second conductive semiconductor layer 40, for example, includes a p type semiconductor layer. The second conductive semiconductor layer 40 may include semiconductor material having the compositional formula of In$_x$Al$_y$Ga$_{1-x-y}$N (0≦x≦1, 0≦y≦1, 0≦x+y≦1), such as InAlGaN, GaN, AlGaN, InGaN, AlInN, AlN, or InN. In addition, the second conductive semiconductor layer 40 may be doped with p type dopant such as Mg, Zn, Ca, Sr, or Ba.

In contrast, the first conductive semiconductor layer 20 may include a p type semiconductor layer and the second conductive semiconductor layer 40 may include an n type semiconductor layer. In addition, a third conductive semiconductor layer (not shown) including an n type or a p type semiconductor layer can be formed on the second conductive semiconductor layer 40. Thus, the light emitting structure may have one of NP, PN, NPN or PNP junction structures. In addition, the conductive dopant can be uniformly or non-uniformly doped in the first and second conductive semiconductor layers 20 and 40. That is, the light emitting structure may have various structures and the embodiment is not limited thereto.

In other words, the light emitting structure including the first conductive semiconductor layer 20, the active layer 30 and the second conductive semiconductor layer 40 can be variously modified without limitation.

The transparent electrode layer 50 includes a first transparent electrode layer 51 formed on the second conductive semiconductor layer 40 and a second transparent electrode layer 52 formed on the first transparent electrode layer 51. In addition, the second electrode 60 includes a constraining layer 61 formed on the first transparent electrode layer 51 and a support layer 63 formed on the constraining layer 61. In addition, the first electrode 70 is formed on the first conductive semiconductor layer 20. According to the second embodiment, the first electrode 70 is formed on the first conductive semiconductor layer 20 and the second electrode 60 is formed on the second conductive semiconductor layer 40.

According to the light emitting device of the second embodiment, the second electrode 60 is anchored to the transparent electrode layer 50. The term, "anchored," includes but not limited to any mechanical combination between the second electrode and the transparent electrode thereby reinforcing the coupling force therebetween. For example, a part of the constraining layer 61 is disposed between the first and second transparent electrode layers 51 and 52, and a part of the second transparent electrode layer 52 is disposed between the constraining layer 61 and the support layer 63.

A top surface of the constraining layer 61 makes contact with a bottom surface of the first transparent electrode layer 51, and a lateral side and a bottom surface of the constraining layer 61 make contact with the second transparent electrode layer 52. The constraining layer 61 partially makes contact with the support layer 63 such that the constraining layer 61 can be electrically connected to the support layer 63.

That is, the constraining layer 61 is constrained by the first and second transparent electrode layers 51 and 52, so the transparent electrode layer 50 can be securely coupled with the second electrode 60.

Strong adhesive force is applied between the first and second transparent electrode layers 51 and 52 and between the constraining layer 61 and the support layer 63. In a conventional structure, the transparent electrode layer may be separated from the second electrode due to weak adhesive force therebetween. Thus, according to the light emitting device of the second embodiment, the second electrode 60 is partially surrounded by the transparent electrode layer 50.

As a result, the transparent electrode layer 50 can be securely coupled with the second electrode 60.

Hereinafter, a method of manufacturing the light emitting device according to the second embodiment will be described with reference to FIGS. 6 to 11. First, a growth substrate 10 is prepared and the light emitting structure including the first conductive semiconductor layer 20, the active layer 30 and the second conductive semiconductor layer 40 is formed on the growth substrate 10. In addition, a buffer layer (not shown) and an undoped GaN layer (not shown) can be formed between the growth substrate 10 and the first conductive semiconductor layer 20.

The growth substrate 10 may include one of sapphire, SiC, Si, GaAs, ZnO, MgO, GaN, Glass or $Ga_2O_3$. The buffer layer may include stack structure, such as $In_xGa_{1-x}N/GaN$ or $Al_x-In_yGa_{1-(x+y)}N/In_xGa_{1-x}/GaN$. For instance, the buffer layer can be grown by injecting trimethyl gallium (TMGa) gas, trimethyl indium (TMIn) gas and trimethyl aluminum (TMAl) gas into the chamber together with hydrogen gas and ammonia gas.

The first conductive semiconductor layer 20 can be grown by injecting TMGa gas and $SiH_4$ gas including n type impurities (for example, Si) into the chamber together with hydrogen gas and ammonia gas. In addition, the active layer 30 and the second conductive semiconductor layer 40 are formed on the first conductive semiconductor layer 20.

The active layer 30 may have a single quantum well structure or a multiple quantum well (MQW) structure. For instance, the active layer 30 may have a stack structure including an InGaN well layer and a GaN barrier layer.

The second conductive semiconductor layer 40 can be grown by injecting TMGa gas and $(EtCp_2Mg)\{Mg(C_2H_5C_5H_4)_2\}$ gas including p type impurities (for example, Mg) into the chamber together with hydrogen gas and ammonia gas.

Figure 7:
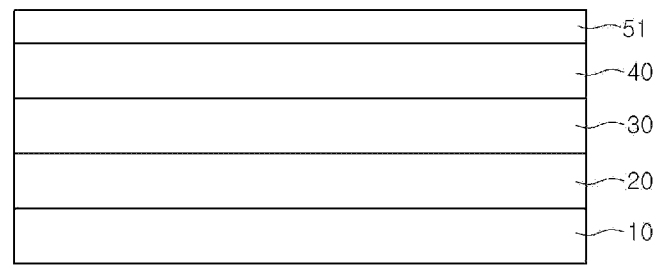

Referring to FIG. 7, the first transparent electrode layer 51 is formed on the second conductive semiconductor layer 40. The first transparent electrode layer 51 can be formed over the whole area of the second conductive semiconductor layer 40.

The first transparent electrode layer 51 may include one of ITO, ZnO, GZO, $RuO_x$, or $IrO_x$, wherein x is an integer.

Figure 8:
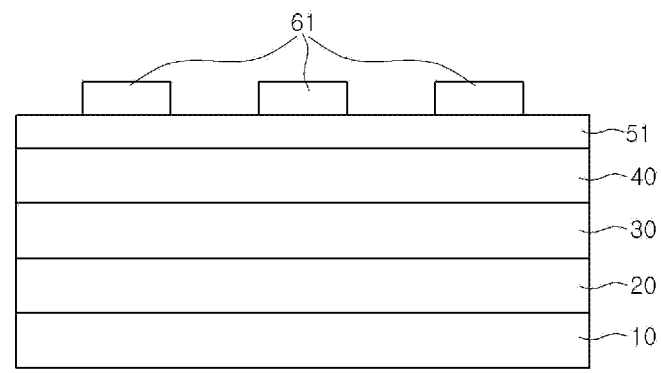

Referring to FIG. 8, the constraining layer 61 is formed on the first transparent electrode layer 51. A plurality of constraining layers 61 can be prepared. The constraining layer 61 can be prepared in the form of a multiple metal layer including an adhesive metal layer or a reflective metal layer. For instance, the constraining layer 61 may include at least one of Cr, Ti or Ni, or at least one of Ag or Al. The constraining layer 61 may have various shapes, such as a circle, a triangle, a hexagon or a cross, when viewed from the top thereof.

Figure 9:
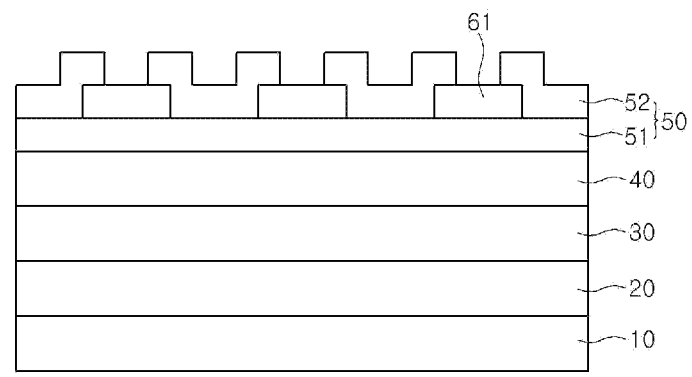

Referring to FIG. 9, the second transparent electrode layer 52 is formed on the first transparent electrode layer 51 and the constraining layer 61 such that the lateral side and the top surface of the constraining layer 61 can be partially covered with the second transparent electrode layer 52. The second transparent electrode layer 52 may include at least one of ITO, ZnO, GZO, $RuO_x$, or $IrO_x$, wherein x is an integer. The second transparent electrode layer 52 can be formed by using material identical to material for the first transparent electrode layer 51.

Thus, the second transparent electrode layer 52 can be securely bonded with the first transparent electrode layer 51.

As the second transparent electrode layer 52 has been formed, the top surface of the constraining layer 61 is partially exposed.

Figure 10:
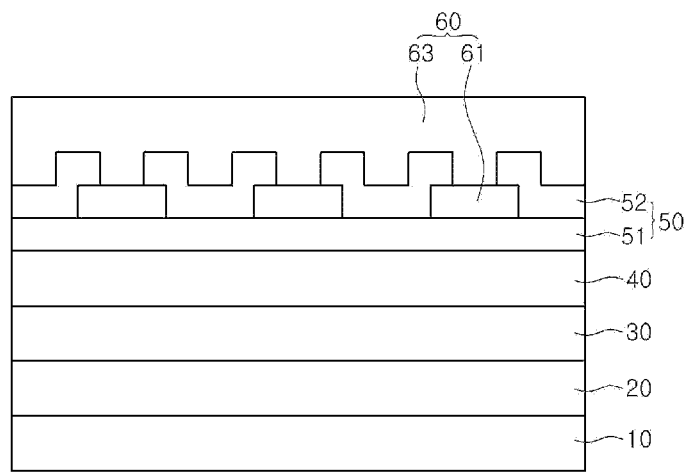

Referring to FIG. 10, the support layer 63 is formed on the constraining layer 61 and the second transparent electrode layer 52. The support layer 63 can be securely bonded with the constraining layer 61.

The support layer 63 can be formed by using the material identical to or different from the material for the constraining layer 61. For instance, the support layer 63 may further include a metal layer, such as an Au layer or a cooper layer in addition to the material for the constraining layer 61.

After the second electrode 60 has been formed, the growth substrate 10 is removed through a laser lift off process or an etching process.

The first electrode 70 is formed on the first conductive semiconductor layer 20.

As a result, the light emitting device according to the second embodiment is manufactured. According to the light emitting device of the second embodiment, the bottom surface, the lateral side and the top surface of the second electrode 60 are partially constrained by the transparent electrode layer 50, so that the coupling force between the second electrode 60 and the transparent electrode layer 50 can be enhanced, so that the electric reliability can be improved.

Figure 12:
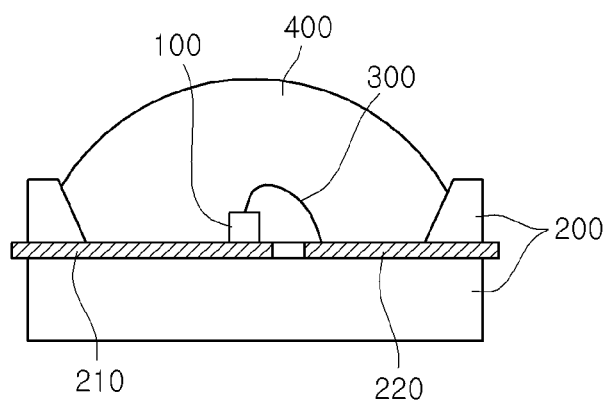
FIG. 12 is a sectional view of a light emitting device package including a light emitting device according to the embodiments.

FIG. 12 is a sectional view of a light emitting device package including the light emitting device according to the embodiments.

Referring to FIG. 12, the light emitting device package includes a body 200, first and second package electrodes 210 and 220 formed on the body 200, the light emitting device 100 provided on the body 200 and electrically connected to the first and second package electrodes 210 and 220, and a molding member 400 that surrounds the light emitting device 100.

The body 200 may include silicon, synthetic resin or metallic material. An inclined surface may be formed around the light emitting device 100.

The first and second package electrodes 210 and 220 are electrically isolated from each other and supply power to the light emitting device 100. In addition, the first and second package electrodes 210 and 220 reflect light emitted from the light emitting device 100 to improve the light efficiency and dissipate heat generated from the light emitting device 100 to the outside.

The light emitting device 100 can be installed on the body 200 or the first and second package electrodes 210 and 220.

The light emitting device 100 can be electrically connected to the first package electrode 210 and/or the second package electrode 220 through a wire 300. According to the vertical type light emitting device as shown in FIG. 11, the light emitting device 100 can be electrically connected to the first package electrode 210 through a die bonding scheme and electrically connected to the second package electrode 220 through the wire 300.

If the horizontal type light emitting device as shown in FIG. 5 is employed as the light emitting device 100, the light emitting device 100 is electrically connected to the first and second package electrodes 210 and 220 through two wires.

The molding member 400 surrounds the light emitting device 100 to protect the light emitting device 100. In addition, the molding member 400 may include phosphors to change a wavelength of the light emitted from the light emitting device 100.

A plurality of light emitting device packages according to the embodiment may be arrayed on a substrate, and an optical member including a light guide plate, a prism sheet, and a diffusion sheet may be provided on the optical path of the light emitted from the light emitting device package. The light emitting device package, the substrate, and the optical member may serve as a backlight unit or an illumination unit. For instance, the illumination system may include a backlight unit, an illumination unit, an indicator, a lamp, or a streetlamp.

Figure 13:
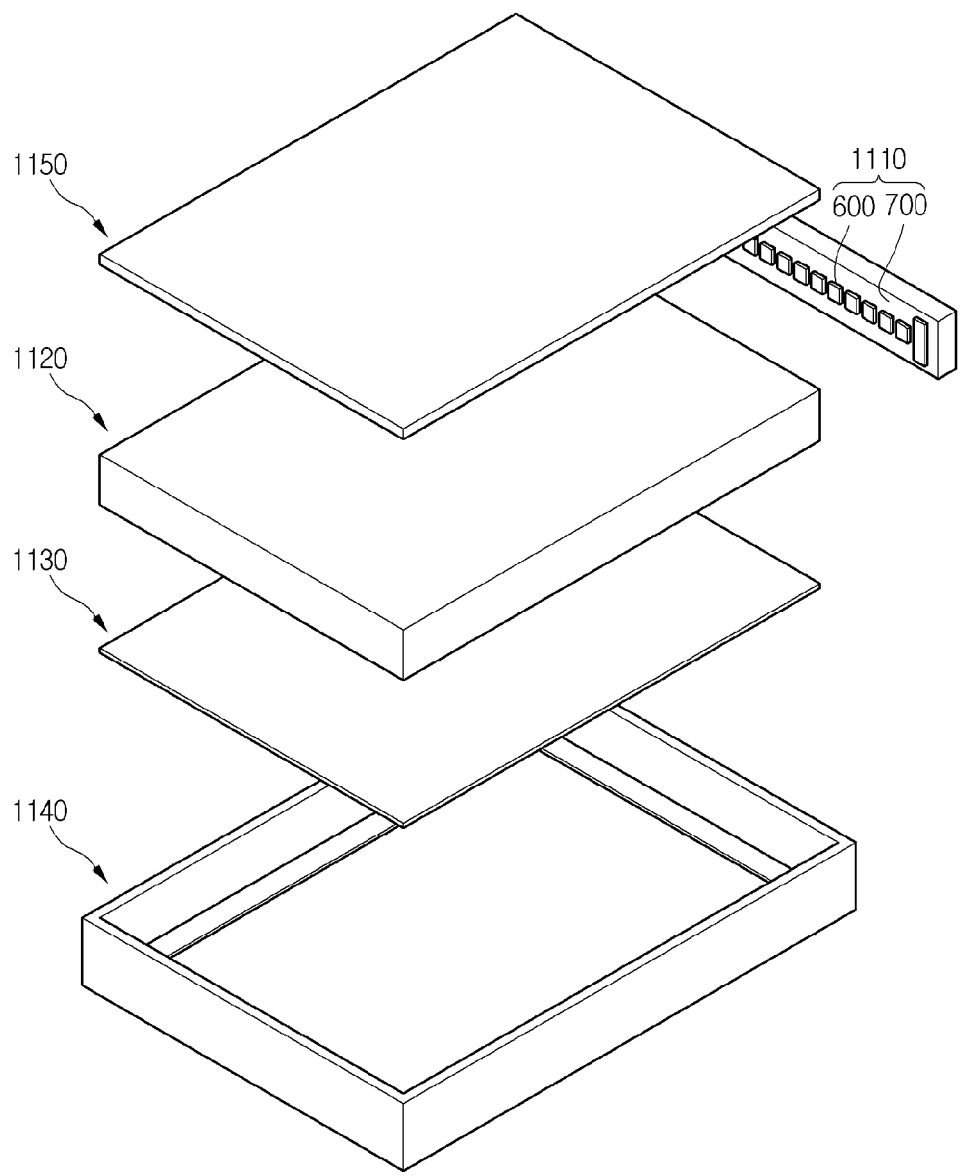
FIG. 13 is an exploded perspective view of a backlight unit including a light emitting device or a light emitting device package according to the embodiments.

FIG. 13 is an exploded perspective view showing a backlight unit 1100 including a light emitting device package according to the embodiment. The backlight unit 1100 shown in FIG. 13 is an example of an illumination system and the embodiment is not limited thereto.

Referring to FIG. 13, the backlight unit 1100 includes a bottom frame 1140, a light guide member 1120 installed in the bottom frame 1140, and a light emitting module 1110 installed at one side or on the bottom surface of the light guide member 1120. In addition, a reflective sheet 1130 is disposed below the light guide member 1120.

The bottom frame 1140 has a box shape having a top surface being open to receive the light guide member 1120, the light emitting module 1110 and the reflective sheet 1130 therein. In addition, the bottom frame 1140 may include metallic material or resin material, but the embodiment is not limited thereto.

The light emitting module 1110 may include a substrate 700 and a plurality of light emitting device packages 600 installed on the substrate 700. The light emitting device packages 600 provide the light to the light guide member 1120. According to the light emitting module 1110 of the embodiment, the light emitting device packages 600 are installed on the substrate 700. However, it is also possible to direct install the light emitting device 100 according to the embodiment.

As shown in FIG. 13, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100 and the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including phosphors.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 14:
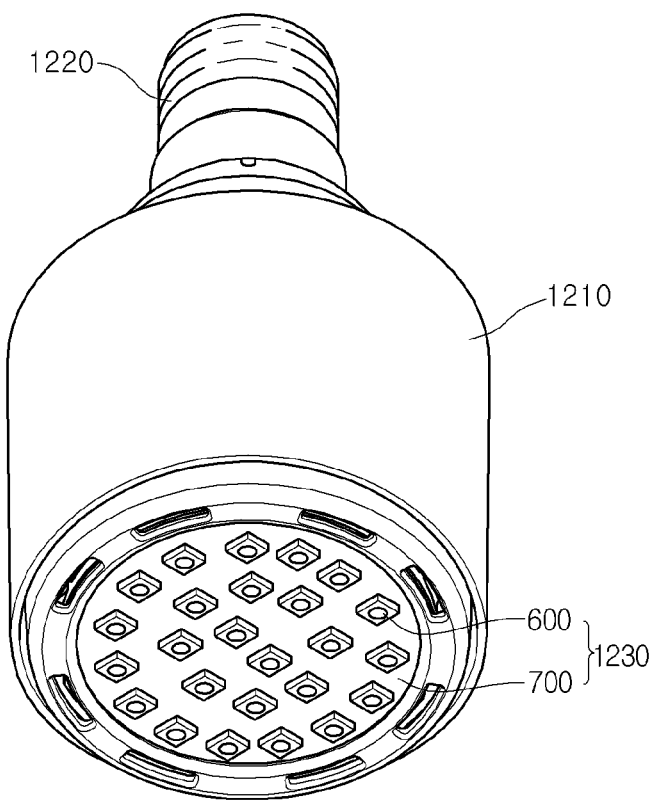
FIG. 14 is a perspective view of an illumination unit including a light emitting device or a light emitting device package according to the embodiment.

FIG. 14 is a perspective view showing an illumination unit 1200 including the light emitting device or the light emitting device package according to the embodiment. The illumination unit 1200 shown in FIG. 14 is an example of an illumination system and the embodiment is not limited thereto.

Referring to FIG. 14, the illumination unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting device package 600 installed on the substrate 700. According to the embodiment, the light emitting device package 600 is installed on the substrate 700 of the light emitting module 1230. However, it is also possible to directly install the light emitting device 100.

The substrate 700 includes an insulating member printed with a circuit pattern. For instance, the substrate 700 includes a PCB (printed circuit board), an MC (metal core) PCB, an F (flexible) PCB, or a ceramic PCB.

In addition, the substrate 700 may include material that effectively reflects the light. The surface of the substrate 300 can be coated with a color, such as a white color or a silver color, to effectively reflect the light.

At least one light emitting device package 600 according to the embodiment can be installed on the substrate 700. Each light emitting device package 300 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 14, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the illumination system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, since the illumination system includes the light emitting device or the light emitting device package having superior reliability, the electric reliability can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure including a first conductive semiconductor layer, a second conductive semiconductor layer, and an active layer between the first and second conductive semiconductor layers;
   a first electrode on the first conductive semiconductor layer;
   a transparent electrode layer on the second conductive semiconductor layer; and
   a second electrode on the transparent electrode layer, wherein the second electrode is anchored to the transparent electrode,
   wherein the transparent electrode layer includes a first transparent electrode layer on the second conductive semiconductor layer and a second transparent electrode layer on the first transparent electrode layer,
   wherein the second electrode includes a constraining layer on the first transparent electrode layer and a support layer on the constraining layer and the second transparent electrode layer, and
   wherein a part of the constraining layer is disposed between the first and second transparent electrode layers.

2. The light emitting device of claim 1, wherein the second electrode is partially surrounded by the transparent electrode layer.

3. The light emitting device of claim 1, wherein the second transparent electrode layer makes contact with a lateral side and a top surface of the constraining layer and a bottom surface of the support layer.

4. The light emitting device of claim 1, wherein the second transparent electrode layer makes contact with a lateral side and a bottom surface of the constraining layer and a top surface of the support layer.

5. The light emitting device of claim 1, wherein a part of the second transparent electrode layer is disposed between the constraining layer and the support layer.

6. The light emitting device of claim 1, wherein the transparent electrode layer includes at least one of ITO, ZnO, GZO, $RuO_x$, and $IrO_x$, wherein x is an integer.

7. The light emitting device of claim 1, wherein the second electrode includes at least one of Cr, Ti, Ni, Ag or Al.

8. The light emitting device of claim 1, further comprising a growth substrate under the light emitting structure.

9. The light emitting device of claim 1, wherein the first transparent electrode layer makes contact with the second conductive semiconductor layer and the second transparent electrode layer is coupled with the first transparent electrode layer, a part of the second transparent electrode layer being disposed between the constraining layer and the support layer.

10. A light emitting device package comprising:
    a body;
    first and second package electrodes on the body;
    a light emitting device of claim 1 electrically connected to the first and second package electrodes on the body; and
    a molding member surrounding the light emitting device on the body.

11. The light emitting device package of claim 10, wherein the first transparent electrode layer makes contact with the second conductive semiconductor layer and the second transparent electrode layer is coupled with the first transparent electrode layer, a part of the second transparent electrode layer being disposed between the constraining layer and the support layer.

12. The light emitting device package of claim 10, wherein the second electrode is partially surrounded by the transparent electrode layer.

13. An illumination system comprising:
a light emitting module including a substrate and at least one light emitting device of claim 1, installed on the substrate as a light source.

14. The illumination system of claim 13, further comprising at least one of a light guide member, a diffusion sheet, a light collection sheet, a brightness enhancement sheet, and a fluorescent sheet which are installed in a path of light emitted from the light emitting module.

15. A method of manufacturing a light emitting device, the method comprising:
forming a light emitting structure including a first conductive semiconductor layer, a second conductive semiconductor layer, and an active layer between the first and second conductive semiconductor layers;
forming a transparent electrode layer on the second conductive semiconductor layer; and
forming a second electrode that is anchored to the transparent electrode layer,
wherein the transparent electrode layer includes a first transparent electrode layer on the second conductive semiconductor layer and a second transparent electrode layer on the first transparent electrode layer,
wherein the second electrode includes a constraining layer on the first transparent electrode layer and a support layer on the constraining layer and the second transparent electrode layer, and
wherein a part of the constraining layer is disposed between the first and second transparent electrode layers.

16. The method of claim 15, wherein the second electrode includes at least one of Cr, Ti, Ni, Ag or Al.

17. A method of manufacturing a light emitting device, the method comprising:
forming a light emitting structure including a first conductive semiconductor layer, a second conductive semiconductor layer, and an active layer between the first and second conductive semiconductor layers;
forming a first transparent electrode layer on the second conductive semiconductor layer;
forming a constraining layer on the first transparent electrode layer;
forming a second transparent electrode layer on the first transparent electrode layer and the constraining layer; and
forming a support layer on the constraining layer and the second transparent electrode layer,
wherein a part of the constraining layer is disposed between the first and second transparent electrode layers.

18. The light emitting device package of claim 10, wherein the second transparent electrode layer makes contact with a lateral side and a top surface of the constraining layer and a bottom surface of the support layer.

19. The light emitting device package of claim 10, wherein the second transparent electrode layer makes contact with a lateral side and a bottom surface of the constraining layer and a top surface of the support layer.

20. The light emitting device package of claim 10, wherein a part of the second transparent electrode layer is disposed between the constraining layer and the support layer.

* * * * *